(12) United States Patent
Cao et al.

(10) Patent No.: US 7,226,718 B2
(45) Date of Patent: Jun. 5, 2007

(54) NON-OUTGASSING LOW ACTIVATION ENERGY RESIST

(75) Inventors: Heidi B. Cao, Portland, OR (US);
Wang Yueh, Portland, OR (US);
Jeanette M. Roberts, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 11/228,589

(22) Filed: Sep. 15, 2005

(65) Prior Publication Data

US 2007/0059634 A1    Mar. 15, 2007

(51) Int. Cl.
*G03F 7/039*    (2006.01)
*G03F 7/38*    (2006.01)
*G03F 7/30*    (2006.01)

(52) U.S. Cl. .............. 430/270.1; 430/330; 430/905; 430/326

(58) Field of Classification Search ............. 430/270.1, 430/326, 330, 905
See application file for complete search history.

(56) References Cited

U.S. PATENT DOCUMENTS 4,897,336 A * 1/1990 Chien .................. 430/197

6,872,505 B1 * 3/2005 Cao et al. ............. 430/270.1

OTHER PUBLICATIONS

Wallraff, G.M., et al. "Studies of Acid Diffusion in Low Ea Chemically Amplified Photoresists" pp. 309-318, from Advances in Resist Technology and Processing XXII, edited by John L. Sturtevart, Proceedings of SPIE vol. 5753 (SPIE, Bellingham, WA 2005) 0277-786X/05.

* cited by examiner

*Primary Examiner*—Richard L. Schilling
(74) *Attorney, Agent, or Firm*—Blakely, Sokoloff, Taylor & Zafman LLP

(57) ABSTRACT

Numerous embodiments of a method to prevent outgassing from a low activation energy photoresist are described. In one embodiment of the present invention, a photoresist material is dispensed over a substrate to form a photoresist layer. The photoresist layer includes branched polymers coupled with acetal or ketal linkages. An exposed portion of the photoresist layer is exposed to a radiation treatment to cleave the acetal or ketal linkages and separate the branched polymers. The photoresist layer is baked at a temperature below about 100° C., and the separated branched polymers are too large to outgass from the photoresist layer.

20 Claims, 9 Drawing Sheets

(Non-outgassing of cleaved polymers)

(Non-outgassing of cleaved polymers)

R1 = H, Alkyl, OH, Cage

R2 = H, Alkyl, Cage

NON-OUTGASSING LOW ACTIVATION ENERGY RESIST

FIELD

Embodiments of the present invention relate to photolithography of semiconductor devices, and more particularly, to a method to prevent outgassing from a low activation energy photoresist.

BACKGROUND

Manufacture of semiconductor devices typically involves a series of processes in which various layers are deposited and patterned on a substrate to form a device of the desired type. Line and space patterns in photoresist are often created to form microelectronic devices. Smaller critical dimensions (CD) for both lines and spaces allow faster circuitry to be created. Deep-ultraviolet (DUV) photolithography is a standard imaging technique for the production of advanced integrated circuits using chemically amplified (CA) resists. Refinements to the physical and chemical properties of the CA resists are important to take advantage of advanced lithography systems, such as extreme ultraviolet (EUV) photolithography.

FIG. 1 is a flowchart illustrating a typical photolithography process. In the photolithography process, a layer of photoresist material is deposited over an underlying layer (formed above a substrate or wafer) that is to be etched. Spin coating is a standard method to apply the photoresist material. The substrate is then subjected to a baking process (also referred to as post-apply bake) to relieve stresses caused by the sheer forces encountered in the spinning process, and remove excess solvent. The photoresist layer is then selectively exposed to radiation (e.g., ultraviolet radiation) with certain regions protected by a mask to form a latent image in the resist layer. The substrate is then subjected to a post-expose bake followed by the development process, in which a photoresist developer, a solution that erodes areas of the photoresist layer exposed to the radiation, is applied to the substrate. The substrate is then rinsed to remove the developer solution, and dried, for example by a spin-dry process.

Image formation in a positive-tone CA photoresist requires conversion of the polymer from an insoluble to a soluble form. Initially, irradiation of the resist triggers a photochemical reaction that produces an acidic product. The proton (i.e., acid catalyst) from this acid binds to an ester functional group attached to the polymer. The protonation induces fragmentation of the ester group that causes the ester to be replaced with a carboxylic acid and an unstable, transient carbocation to be formed. The carbocation releases a proton, which then protonates another ester group to repeat the process, resulting in the deprotection of many ester groups in the resist. When in contact with an aqueous developer, the carboxylic acid groups formed during deprotection will ionize, rendering the polymer soluble.

One of the most difficult challenges for chemically amplified resists is meeting the dense line/space resolution targets. For current commercially available high activation energy resists, high bake temperatures are required for deprotection of the resist. Moreover, the acid catalyst will have large diffusion lengths at high temperatures, which limits the resolution of the resist. Alternatively, low activation energy resists are available, which undergo deprotection at lower temperatures relative to high activation energy resists. The diffusion of the acid catalyst may be lower in low activation energy resists, thereby resulting in higher resolution. For example, hydrolysis of acetal protecting groups is a low activation energy reaction and therefore will occur at low temperatures. Acetal/ketal groups will undergo a hydrolysis reaction in the presence of an acid as shown in FIG. 2. However, one problem with typical low activation energy resists is that because the deprotection reaction does not require high temperatures, outgassing of the deprotection groups can occur at temperatures below that of the post-expose bake. For example, outgassing can occur during the radiation exposure process.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components, methods, semiconductor equipment and processes have not been described in detail in order to avoid unnecessarily obscuring embodiments of the present invention.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of a method and apparatus to increase the line/space resolution in photoresists are described. In one embodiment, a chemically amplified photoresist includes a low activation energy photoresist with acetal linkages in the polymer backbone. Because the photoresist possesses low activation energy properties, a lower acid diffusion is achieved with high line/space resolution. Additionally, there is no outgassing of the deprotected groups following the post exposure bake process because the polymer groups are too large to escape from the photoresist, thereby preventing contamination of the exposure tool.

Figure 1:
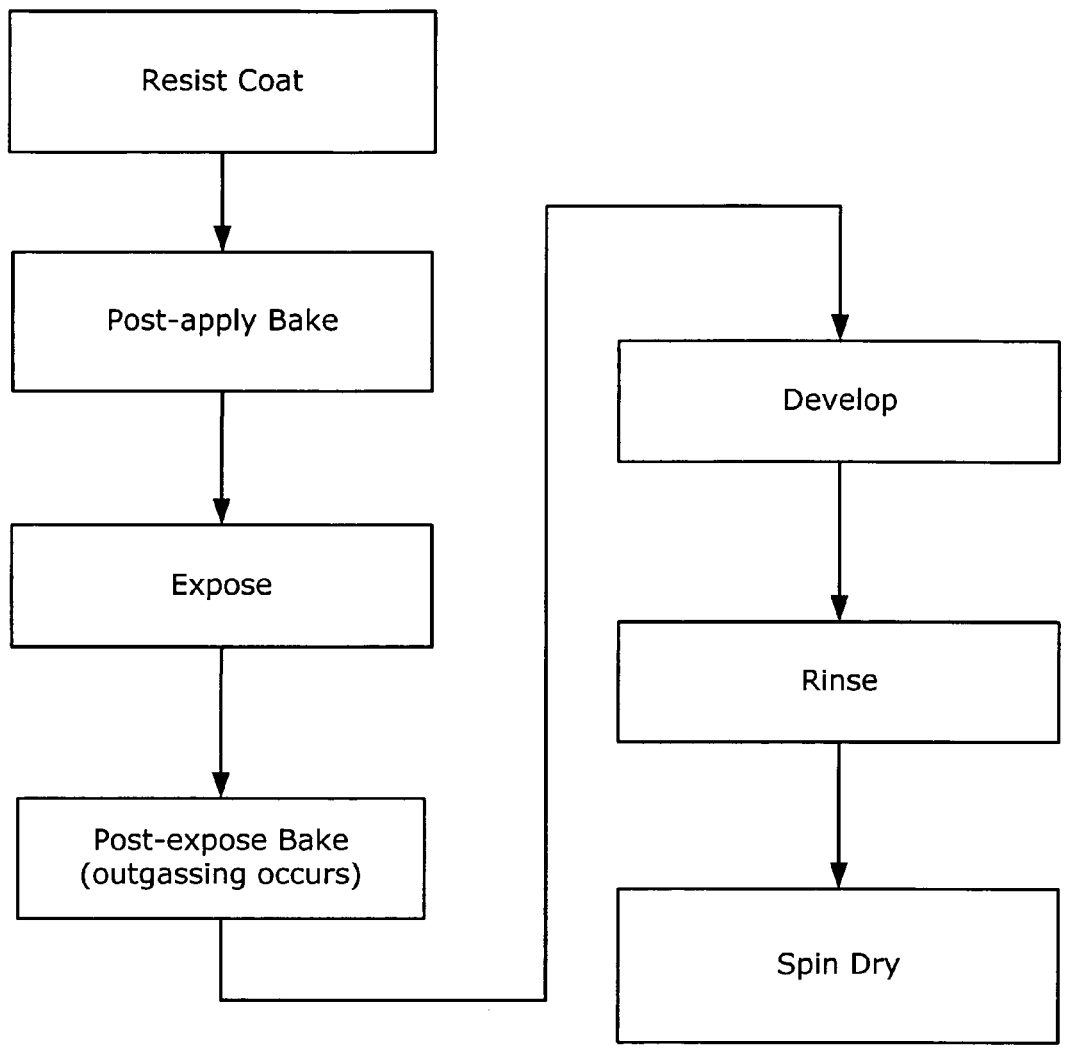
FIG. 1 is a flow chart of a typical photolithography process.
Figure 2:
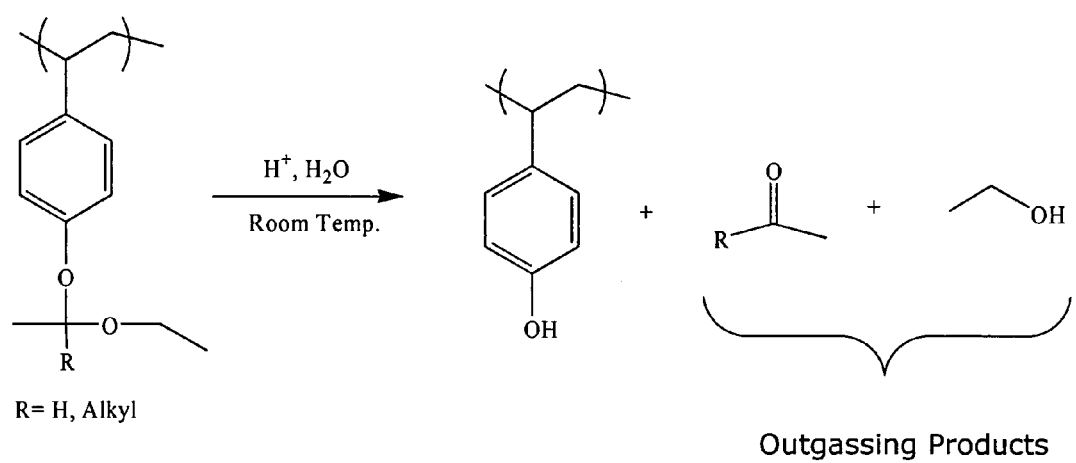
FIG. 2 illustrates a hydrolysis reaction for acetal/ketal groups in the presence of an acid.
Figure 3:
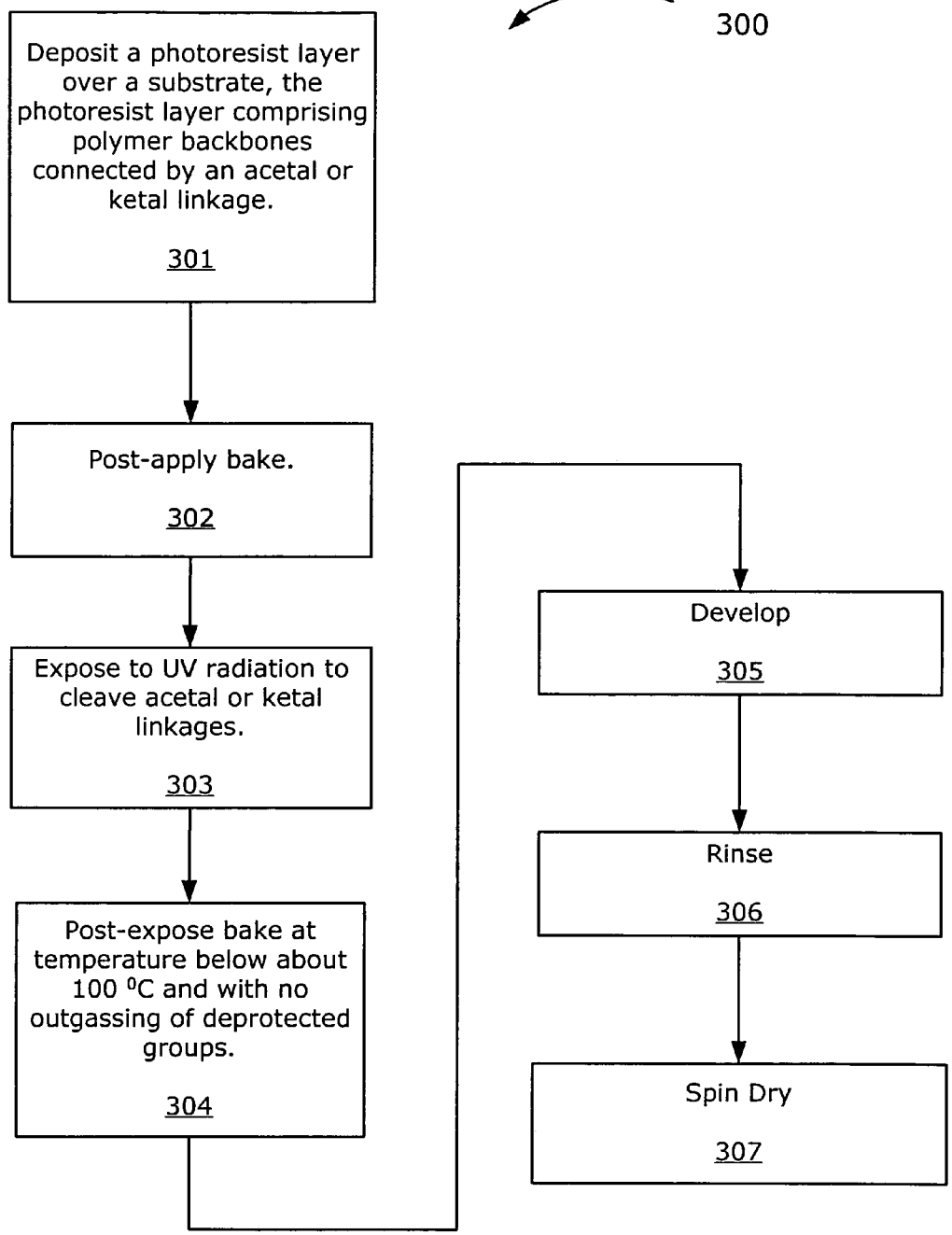
FIG. 3 is a flowchart describing a method to prevent outgassing from a photoresist.

The flowchart of FIG. 3 and the structure of FIGS. 4–7, taken together, illustrate one embodiment of a method of a photolithography process to improve the line/space resolution of chemically amplified photoresists and prevent outgassing of deprotected groups following the post exposure bake process. In particular FIGS. 4–7 illustrate cross-sectional views of a partially processed circuit structure 400 in one embodiment of the present invention. Circuit structure 400 includes substrate 403 that may be a wafer substrate having circuit elements thereon, as well as one or more layers or levels of interconnection to circuit elements. Substrate 403 may also be a wafer upon which other manufacturing and processing operations may be performed so as to form various electrical components such as transistors. A dielectric material is deposited over substrate 403 to form dielectric layer 404. The dielectric layer 404 may be, for example, silicon dioxide ($SiO_2$) formed by a tetraethyl orthosilicate deposition process. Other suitable materials for the dielectric material may be contemplated, including materials having dielectric constants less than the dielectric constant of $SiO_2$ (e.g., "low k" materials), including polymers. Although the terms "substrate", "dielectric", and "photoresist" are used herein, other terms may be used to describe the affected layers without departing from the intended scope of various embodiments of the invention. As used herein, the terms "above" and "below" refer to the orientation shown in the figures. The physical orientation (with respect to gravity) of an integrated circuit structure during fabrication may be different. The term "structure," as used herein, refers collectively to the substrate and all existing layers at the indicated stage in the fabrication process, and to the physical elements in those layers that are being processed together. It is understood that the structures of FIGS. 4–7 are not drawn to scale, and the relative dimensions of the physical structure should not be inferred from the relative dimensions shown in the drawings.

Figure 4:
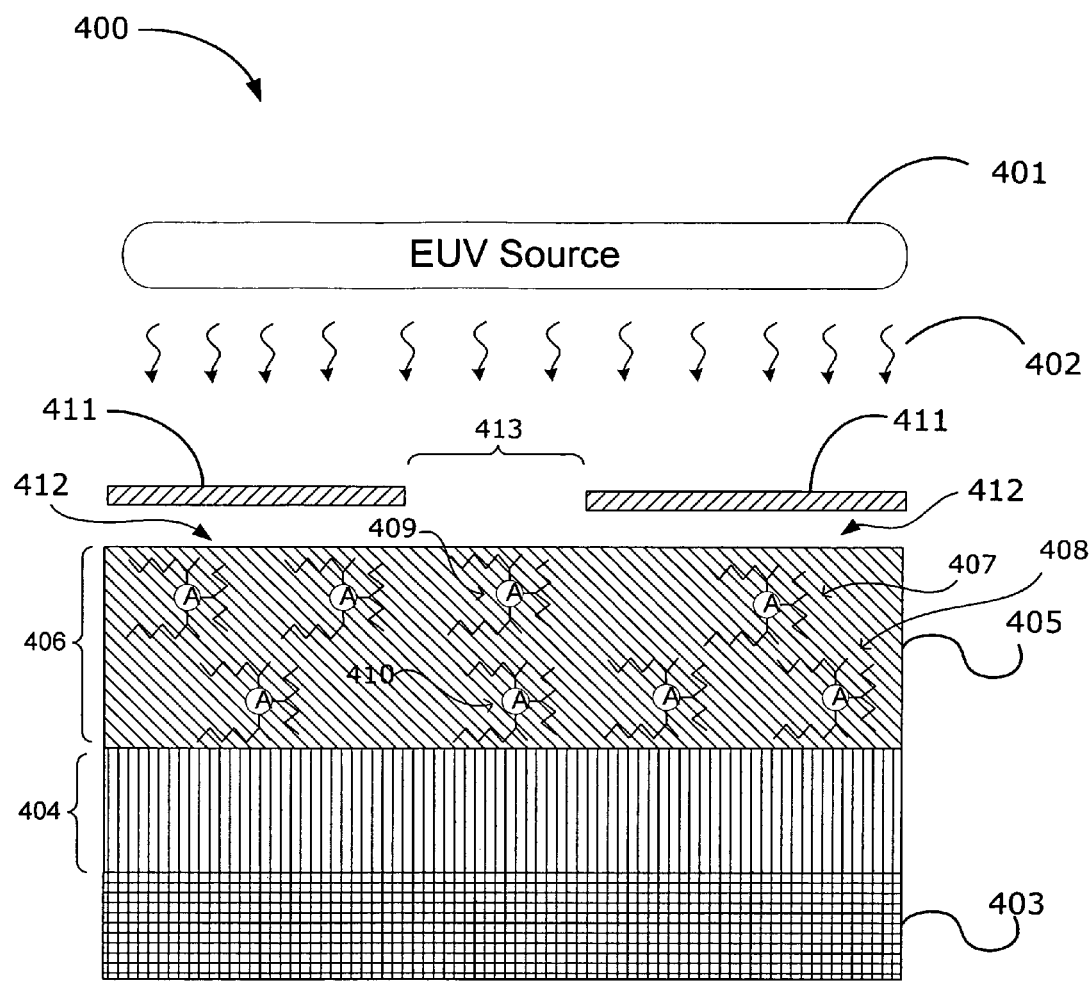
FIG. 4 illustrates one embodiment of a structure prepared for a photolithography process.
Figure 7:
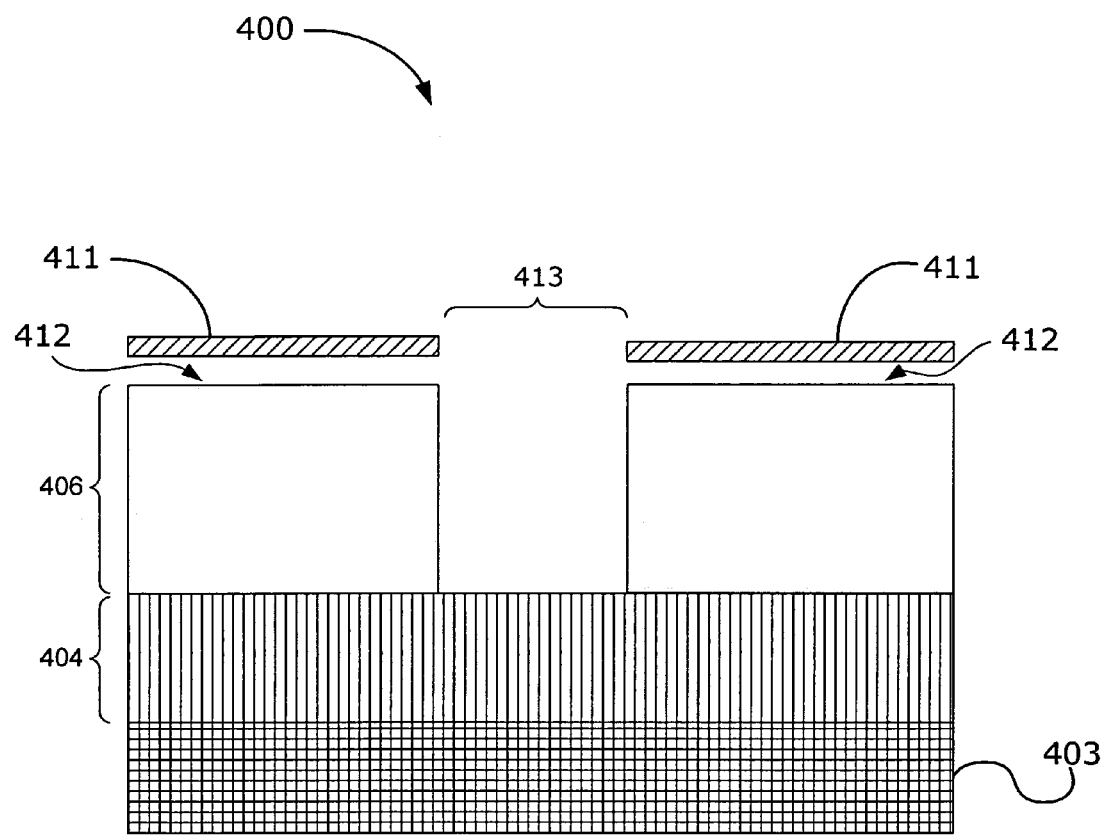
FIG. 7 illustrates a structure after the rinse solution has been dried off, with the photoresist layer etched to expose a portion of dielectric layer.
Figure 8:
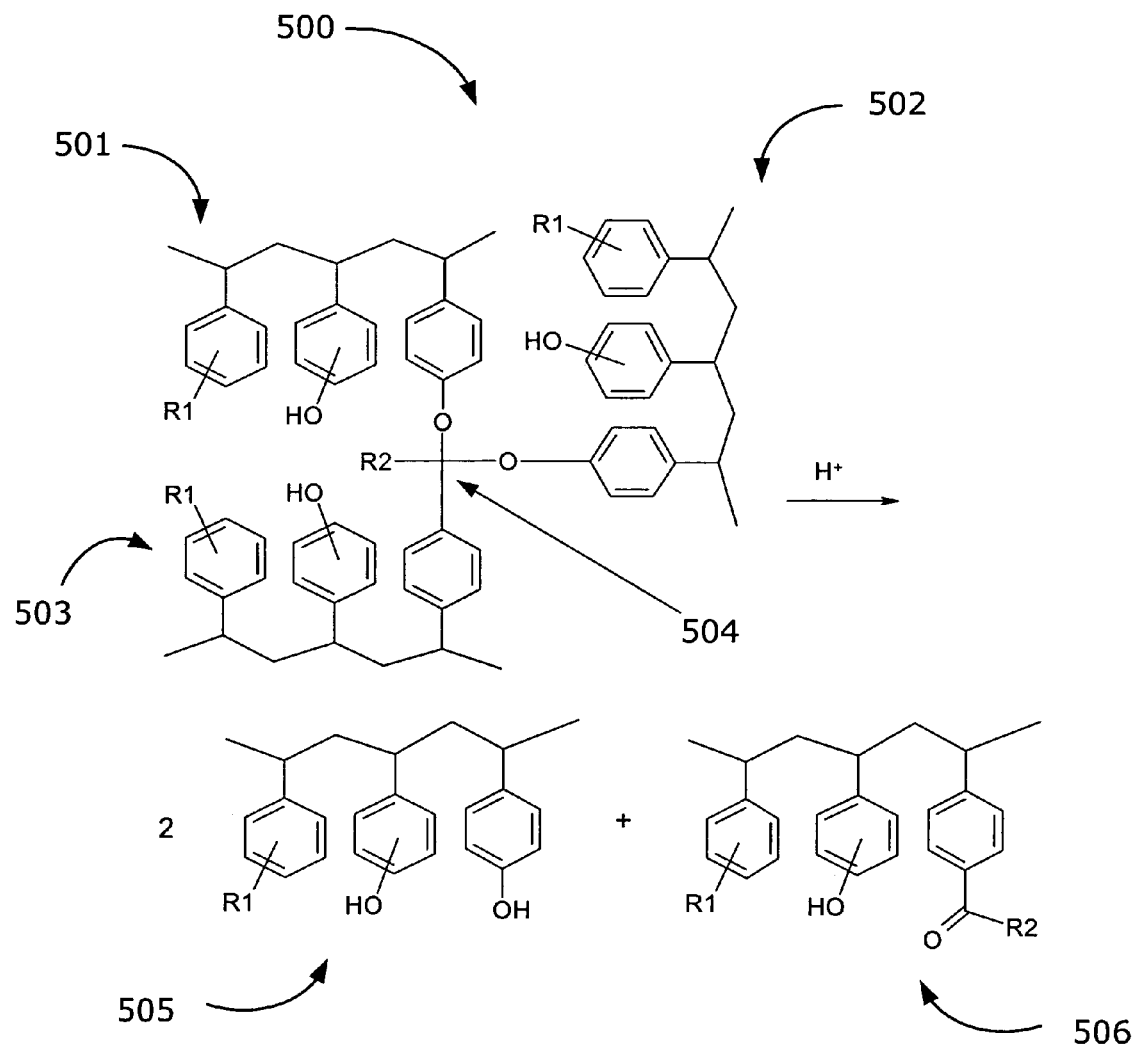
FIG. 8 illustrates one embodiment of a chemical structure for the photoresist polymer with acetal linkages in the backbone.

As illustrated in FIG. 4, structure 400 is prepared for a photolithography process to form a desired pattern, by defining a portion of a photoresist layer 406 to be removed. In one embodiment, the photolithography described herein relates to a positive photoresist methodology. The photoresist layer 406 is formed over substrate 403 and dielectric layer 404 by a spin coating process or other coating processes known in the art, in which a photoresist material 405 (in the form of a solution) is dispensed over a spinning substrate 403, block 301. Photoresist layer 406, in one embodiment, may be incorporated with branched polymer chains that are coupled to each other with acetal or ketal linkages. The branched polymer chains coupled with acetal linkages of photoresist layer 406 are generally represented by structures 407, 408, 409, and 410. FIG. 8 illustrates one embodiment of a chemical structure for the photoresist polymer with acetal linkages in the backbone. Polymer compound 500 includes three polymer groups 501, 502, and 503 coupled together with acetal linkage 504. The acetal or ketal linkages of the polymer incorporated into the photoresist provide low activation energy properties. One property allows the deprotection reaction to occur at low temperatures, and in one embodiment, at a temperature of approximately room temperature. As discussed in greater detail below with respect to FIGS. 4–7, when the acetal linkage 504 is cleaved during the post exposure bake process, the branched polymer structure of cleaved polymer groups 501, 502, 503 are too large to outgass from the photoresist 406. In alternative embodiments, other types of low activation energy linkages may be used to couple the branched polymer chains. In one particular embodiment, the linkage may be a ketal linkage.

In one particular embodiment, forming photoresist layer 406 includes spreading the photoresist material 405 on the surface dielectric layer 404 by spin-coating at about 3,000 rpm for about 60 seconds to thin photoresist layer 406 to a thickness of about 100–200 nanometers, and heating structure 400 at about 115° C. for about 2 minutes to bake photoresist layer 406, block 302. In one embodiment, photoresist layer 406 can be a chemically amplified resist (CAR), a novalak CAR, a poly(t-butoxysiloxane) CAR, or other types of positive tone resists known in the art. In an alternative embodiment, photoresist layer 406 can be EUV resists, for example, acrylic polymer (such as acrylate, methacrylate, acrylate with a methyl group on the backbone, acrylate-methacrylate copolymers), cyclo-oelfin, and phenolic based resins.

Following the post-apply bake process of photoresist layer 406, mask 411 is aligned over structure 400, which defines opening 413 on mask 411 for exposure to radiation and encode an image in photoresist layer 406. Mask 411 may be, for example, any type of masking material known in the art. Having properly aligned mask 411 over structure 411, structure 400 is exposed to a radiation source, such as an EUV radiation source 401, block 303. In one embodiment, radiation from an EUV light source passes through opening 413 of mask 411. Region 412 of photoresist layer 406 is shielded by mask 411, preventing exposure to EUV radiation 402. The radiation that passes through opening 413 contacts photoresist layer 406 in the region exposed by opening 413 of mask 411. As illustrated in FIG. 4, there are polymer groups within the exposed portion of photoresist layer 406 (e.g., polymer groups 409, 410) and polymer groups that are not within the exposed portion of photoresist layer 406 (e.g., polymer groups 407, 408).

The exposure to radiation changes the chemical structure of photoresist layer 406 in the exposed region from a relatively non-soluble state to much more soluble state. In one embodiment, ultraviolet radiation having a wavelength between about 10 nm to about 250 nm can be applied to photoresist layer 406. In one embodiment, photoresist layer 406 that is a CAR resist is exposed to radiation (DUV) having a wavelength of about 248 nm. In another embodiment, the wavelength of radiation can be about 193 nm. In yet another embodiment, photoresist layer 406 is exposed to extreme ultraviolet radiation (EUV) having a wavelength of about 13.5 nm.

Figure 5:
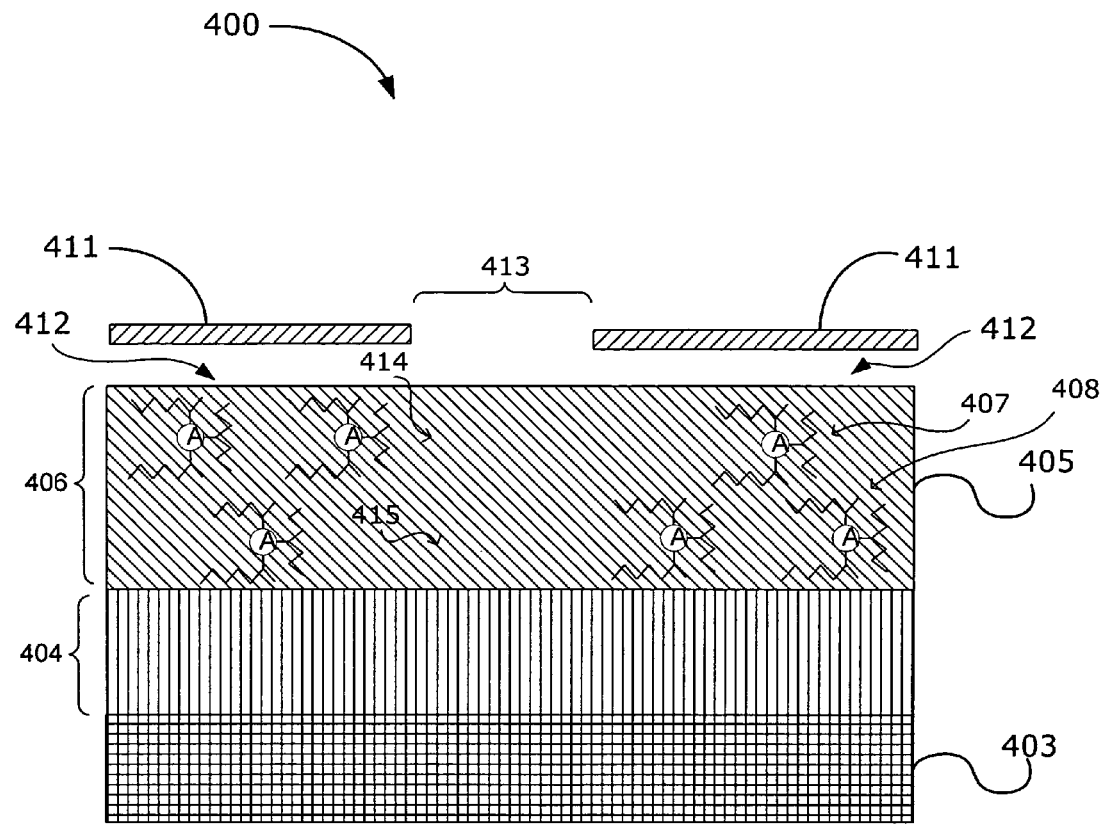
FIG. 5 illustrates the result of a deprotection reaction with cleaved portions of polymer groups within the exposed portion of the photoresist.

After exposure to the ultraviolet radiation, structure 400 undergoes a post-expose bake process, block 304. In chemically amplified photoresists (CAR), the effect of incident radiation is to generate a photoacid. The photoacid serves as a catalyst for deprotection reaction that occurs during the post exposure bake process. The region(s) of the photoresist where acid formed by exposure to radiation serves as a catalyst for a chemical reaction during the post exposure bake process, thereby removing protection groups attached to the polymer and renders them soluble in a developer. As illustrated in FIG. 5, the result of the deprotection reaction is shown with cleaved portions of polymer groups within the exposed portion of the photoresist (represented by polymer groups 414, 415). Because of the large size of the cleaved polymer groups 414, 415, no outgassing occurs from the photoresist layer 406. Referring again to FIG. 8, one embodiment of a deprotection reaction is shown for polymer compound 500. The exposure of polymer compound 500 to a photoacid results in the two groups of a polymer 505 a hydroxyl group and one polymer 506 with a ketone or acetyl aldehyde group. In one embodiment, the side groups (e.g., R1, R2) may be varied to optimize the properties of polymer compound 500. For example, in one embodiment, the R1 group may be, but not limited to, hydrogen, alkyl, alcohol, or a caged structure. In another embodiment, the R2 group may be, but not limited to, hydrogen, alkyl, or a caged structure. Moreover, hydroxyl groups may be attached to the caged structures to increase solubility to a developer solution. For EUV photolithography, aromatic sidechains may provide a high quality of etch resistance and low absorbance. In another embodiment, the R1 group may be selected to have an effect the deprotection rate. For example, the R1 group may be an electron withdrawing group such as hydroxyl styrene to reduce the reaction rate of deprotection.

The acetal or ketal linkages (e.g., linkage 504) that couple the branched polymers together provide a low activation energy reaction for hydrolysis, allowing for the reaction to occur at temperatures below those of high activation energy photoresists. In one embodiment, the post exposure bake process may be performed at temperatures below about 100° C. In one particular embodiment of the present invention, the post exposure bake process for photoresist layer 406 may be performed at temperatures of approximately 70° C. to about 90° C. In one embodiment of the present invention, the photoresist layer 406 may be subject to a first temperature during exposure to the ultraviolet radiation and a second temperature during the post exposure bake process. In one particular embodiment, the second temperature is greater than the first temperature.

Figure 6:
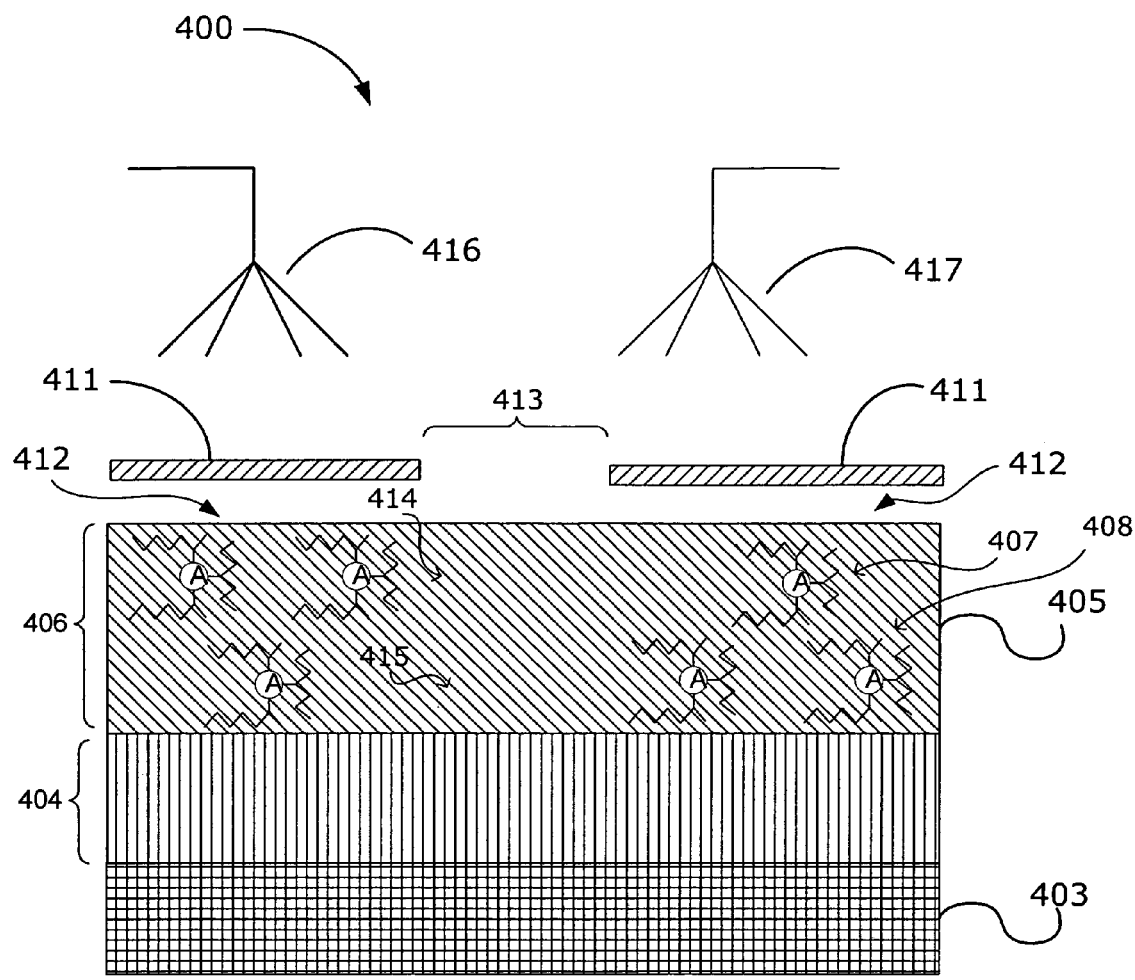
FIG. 6 illustrates one embodiment of a configuration for rinsing a structure with dispensers to spray a rinse solution over the photoresist layer.

After the post exposure bake process, deprotected regions of photoresist layer 406 may be removed easily with a developer solution during the developer process. Following the post exposure bake process, a photoresist developer (not shown) is applied to photoresist layer 406 to remove the deprotected photoresist layer 406 (e.g., deprotected groups 414, 415) in the exposed region, block 305. The photoresist developer retains the generally insoluble photoresist layer 406 over substrate 403 in the region that was not exposed to ultraviolet radiation 402 from the ultraviolet source 401 and/or areas in the bulk portion of photoresist layer 406. In one embodiment, application of the developer can involve immersing structure 400 in a solution of developer and water. For a positive-tone photoresist, a tetra methyl ammonium hydroxide (TMAH) aqueous solution is a developer that will enhance dissolution of the exposed photoresist layer 406. Structure 400 is then rinsed to remove the developer, block 306. FIG. 6 illustrates one embodiment of a configuration for rinsing structure 400 in which dispensers 416 and 417 spray a rinse solution (e.g., DI water) over photoresist layer 406.

Structure 400 is then dried with a spin-dry process to remove the rinse solution, block 307. FIG. 7 illustrates structure 400 after the rinse solution has been dried off, with photoresist layer 406 etched to expose a portion of dielectric layer 404. The method described with respect to FIG. 3 and FIGS. 4–7 can be performed in an integrated photolithography system that moves structure 400 from one tool to another tool automatically. For example, structure 400 can be moved along a wafer track from one processing tool (e.g., to form photoresist layer 406 over substrate 403) to another processing tool (e.g., to apply the developer).

In the method described above with respect to the flowchart 300 of FIG. 3, the structures of FIGS. 4–7, and the reaction of FIG. 8, the photoresist material (e.g., photoresist material 405) is a low activation energy resist with acetal or ketal linkages in the backbone. The low activation energy property of the photoresist allows for lower acid diffusion which results in higher resolution (i.e., line/space resolution) relative to a photoresist having high activation energy properties. Another advantage of the low activation energy photoresist described herein is the relatively low post exposure bake temperature sensitivity. In one embodiment, the photoresist material may have a post exposure bake temperature sensitivity of about 1.5 nm/C for structures with about a 70 nm ½ pitch and a sensitivity of about 1.0 nm/C for structures with about a 32 nm ½ pitch. Lastly, the branched structures of the polymer compounds (e.g., polymer 500) that make up the photoresist material will not outgas when deprotected. The deprotection of the polymer compound will cause chain scission of the polymer backbone when the acetal linkage (e.g., linkage 504) is cleaved leaving hydroxyl groups (e.g., group 505).

Figure 9:
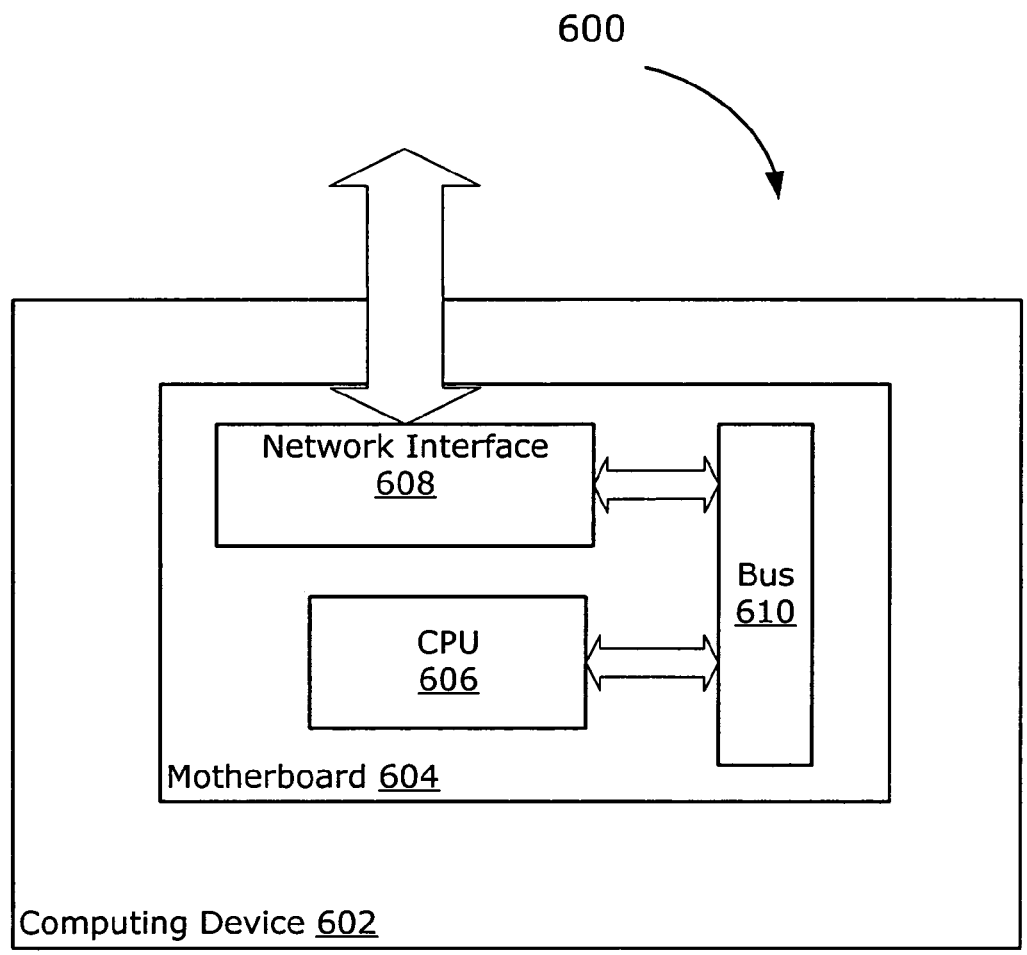
FIG. 9 illustrates a system in accordance with one embodiment having structures or components formed by the methods described herein.

FIG. 9 illustrates a system 600 in accordance with one embodiment having structures or components formed by the methods described herein. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise transistors or other circuit elements that have been formed by the earlier described photolithography methods, for example, the method described above with respect to flowchart 300 of FIG. 3 and structure 400 of FIGS. 4–7.

In the foregoing specification, the invention is described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
    forming a photoresist layer over a substrate, the photoresist layer comprising branched polymers coupled with acetal linkages;
    cleaving the acetal linkages to separate the branched polymers; and
    baking the photoresist layer at a temperature below about 100° C., wherein the separated branched polymers are too large to outgas from the photoresist layer.

2. The method of claim 1, wherein cleaving further comprises exposing the photoresist layer with extreme ultraviolet radiation.

3. The method of claim 2, wherein exposing further comprises treating the photoresist layer with radiation a wavelength between about 10 nm to about 250 nm.

4. The method of claim 1, wherein the photoresist layer comprises a chemically amplified photoresist.

5. The method of claim 1, wherein baking further comprises applying a temperature between about 70° C. to about 90° C. to the photoresist layer.

6. The method of claim 1, wherein the separated branched polymers comprise hydroxyl groups.

7. The method of claim 1 further comprising applying a developer to the portion of the photoresist layer exposed the radiation treatment to form a pattern.

8. The method of claim 2, wherein a first temperature of the photoresist layer during an exposure to the extreme ultraviolet radiation is less than a second temperature during a baking of the photoresist layer.

9. A method, comprising:
   forming a photoresist layer, the photoresist layer comprising branched polymers coupled with ketal linkages to provide a low activation energy for hydrolysis;
   cleaving the ketal linkages to separate the branched polymers; and
   baking the photoresist layer at a temperature below about 100° C., wherein the separated branched polymers are too large to outgass from the photoresist layer.

10. The method of claim 9, wherein exposing further comprises exposing the photoresist layer with extreme ultraviolet radiation.

11. The method of claim 10, wherein exposing further comprises treating the photoresist layer with radiation a wavelength between about 10 nm to about 250 nm.

12. The method of claim 9, wherein the photoresist layer comprises a chemically amplified photoresist.

13. The method of claim 9, wherein baking further comprises applying a temperature between about 70° C. to about 90° C. to the photoresist layer.

14. The method of claim 9, wherein the separated branched polymers comprise hydroxyl groups.

15. The method of claim 10, wherein a first temperature of the photoresist layer during an exposure to the extreme ultraviolet radiation is less than a second temperature during a baking of the photoresist layer.

16. The method of claim 10, further comprising applying a developer to the portion of the photoresist layer exposed the radiation treatment to form a pattern.

17. An apparatus, comprising:
   a substrate; and
   a photoresist layer formed above the substrate, the photoresist layer comprising branched polymers coupled with acetal linkages, wherein when the acetal linkages are cleaved during a hydrolysis reaction, and wherein the separated branched polymers are too large to outgass from the photoresist layer.

18. The apparatus of claim 17, wherein the photoresist layer comprises a low activation energy resist.

19. The apparatus of claim 17, wherein the hydrolysis reaction occurs at a temperature between about 70° C. to about 90° C.

20. The apparatus of claim 17, further comprising branched polymers coupled with ketal linkages, wherein when the ketal linkages are cleaved during a hydrolysis reaction, and wherein the separated branched polymers are too large to outgass from the photoresist layer.

* * * * *